United States Patent [19]

Toyama et al.

[11] Patent Number: 5,258,630

[45] Date of Patent: Nov. 2, 1993

[54] LIGHT-EMITTING DIODE WITH NON-REFLECTIVE DIFFUSION REGION PERIPHERY

[75] Inventors: Toshihko Toyama; Masayoshi Koike, both of Kanagawa, Japan

[73] Assignee: Eastman Kodak Company, Rochester, N.Y.

[21] Appl. No.: 818,652

[22] Filed: Jan. 6, 1992

[30] Foreign Application Priority Data

Jan. 17, 1991 [JP] Japan .................................. 3-004017

[51] Int. Cl.$^5$ ............................................ H01L 33/00
[52] U.S. Cl. ..................................... 257/98; 257/635; 257/636
[58] Field of Search ..................... 257/88, 91, 98, 99, 257/635, 639, 636, 638

[56] References Cited

U.S. PATENT DOCUMENTS

| | | | |
|---|---|---|---|
| 5,038,186 | 8/1991 | Nishioka et al. | 257/88 |
| 5,055,893 | 10/1991 | Sasagawa | 257/88 |
| 5,077,587 | 12/1991 | Albergo et al. | 257/98 |
| 5,084,742 | 1/1992 | Tokuda | 257/88 |
| 5,105,236 | 4/1992 | Hayakawa | 257/88 |

FOREIGN PATENT DOCUMENTS 1-49282  2/1989  Japan ..................................... 257/99

Primary Examiner—Rolf Hille
Assistant Examiner—Minhloan Tran
Attorney, Agent, or Firm—Raymond L. Owens; Kevin A. Sembrat

[57] ABSTRACT

A light-emitting diode having a structural arrangement that permits efficient external emission of light emitted from the peripheral wraparound portion of the diffusion region.

2 Claims, 1 Drawing Sheet

LIGHT-EMITTING DIODE WITH NON-REFLECTIVE DIFFUSION REGION PERIPHERY

BACKGROUND OF THE INVENTION

1. Field of the Invention

The present invention relates to a light-emitting diode, and more particularly to a light-emitting diode in which a diffusion layer formed using a diffusion mask is formed into a diffusion region by the selective diffusion of an impurity metal.

2. Description of the Prior Art

The light, small light-emitting diode (LED) is extensively utilized in various fields. In recent years the merits of the LED have been utilized to realize practical LED printers and other such devices, and various other applications are being proposed in which LEDs are used as a light source.

FIG. 2 is a cross-sectional view of a typical conventional light-emitting diode. With reference to FIG. 2, an n-GaAsP layer (hereinafter "n-layer") 12 formed on an n-GaAs substrate (hereinafter 37 substrate") 10, and then formed on the n-layer 12 is a diffusion mask layer 14 that is constituted of a substance such as SiN and provided with an opening 14A of a prescribed pattern. Zinc or other such impurity element is diffused into the n-layer 12 through the diffusion mask layer opening 14A, thereby forming a p-diffusion region 18. A p-electrode 20 constituted of gold or other such substance is formed on the p-diffusion region 18 and an n-electrode 22 on the under-surface of the substrate 10. Reference numeral 16 denotes a surface protective layer of SiN or the like.

In the conventional LED thus configured, the application of a voltage across the p-electrode 20 and n-electrode 22 sets up a flow of current that stimulates the emission of light in the area of the junction formed by the n-layer 12 and p-diffusion region 18, and this light is directed upward through the protective layer 16. This protective layer 16 is usually constituted so as not to reflect light from the diffusion region 18.

However, a drawback with this type of conventional LED is that in the diffusion process the p-diffusion region 18 expands laterally and wraps around under the diffusion mask layer, and light emitted from this peripheral wraparound portion of the junction is therefore attenuated by the diffusion mask layer located above, adversely affecting emission efficiency. A further problem is that as the light intensity at the peripheral portions is lower than at the center of the p-diffusion region 18, the light output distribution in the emission plane is not uniform.

SUMMARY OF THE INVENTION

The object of the present invention is therefore to provide a light-emitting diode that enables efficient external emission of light emitted from the peripheral wraparound portion of the diffusion region.

In accordance with the present invention this object is attained by a light-emitting diode comprising a diffused layer that constitutes one side a p-n junction wherein light emission occurs, a diffusion mask layer that is formed on the diffused layer and is provided with an opening of a prescribed pattern, a diffusion region that constitutes the other side of the p-n junction and is formed by diffusion in the diffused layer via the opening of the diffusion mask layer, and a surface protection layer that covers both the diffused layer and the diffusion mask layer formed thereon, wherein portions of the diffusion mask layer and surface protection layer that are located above the part of the diffusion region that forms a wraparound region extending laterally from the opening do not reflect light emitted from peripheral wraparound portion of the junction.

As those parts of the diffusion mask layer and surface protection layer that are above the wraparound region do not reflect light emitted from this peripheral wraparound portion of the junction, it is possible to obtain efficient external emission of light from this wraparound portion, and a uniform distribution of light output in the emission plane.

Further features of the invention, its nature and various advantages will become more apparent from the accompanying drawings and following detailed description of the invention.

DESCRIPTION OF THE PREFERRED EMBODIMENT

Figure 1:
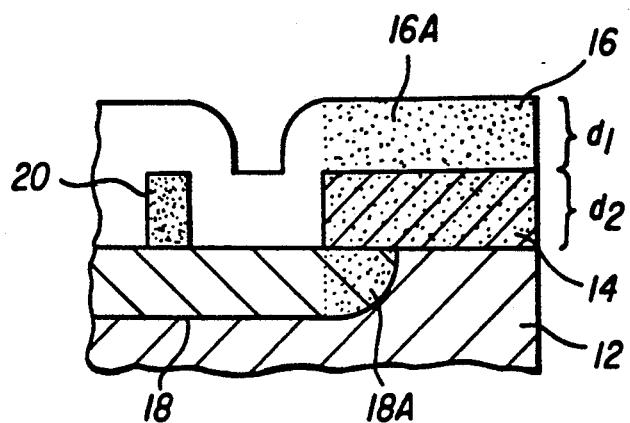
FIG. 1 is a cross-sectional view of the upper edge of a light-emitting diode according to the present invention.
Figure 2:
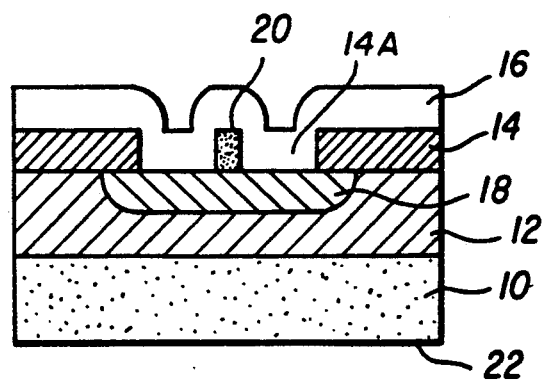
FIG. 2 is a cross-sectional view of a conventional light-emitting diode.

FIG. 1 is a magnified view of the upper edge portion of a light-emitting diode according to the present invention. The LED shown in FIG. 1 has the same epitaxial structure as the conventional LED of FIG. 2, and the constituent composition is also the same.

The characterizing feature of the present invention is the efficiency of the external emission of light from the peripheral junction portion of the wraparound diffusion region 18A. More specifically, the portions 16A and 14 of the surface protection layer 16 and diffusion mask layer 14, respectively, that are located above the part of the wraparound diffusion region 18A of the junction are each constituted so as not to reflect light emitted from the peripheral wraparound portion 18A. For this, the portions 16A and 14 are each constituted to satisfy the following relations.

$$n_1^2 = n_0 \cdot n_3 \quad (1)$$

$$n_1 \cdot d_1 = \alpha \cdot \lambda/4 \text{ (where } \alpha = 1, 3, 5, \ldots \text{)} \quad (2)$$

$$n_2 = n_1 \quad (3)$$

$$n_2 \cdot d_2 = \beta \lambda/4 \text{ (where } \beta = 2, 4, 6, \ldots \text{)} \quad (4)$$

Here, $n_0$, $n_1$, $n_2$ and $n_3$ are the refractive index of, respectively, air layer, surface protection layer, diffusion mask layer, and diffused layer, and $d_1$ and $d_2$ are the thickness of the protection layer and diffusion mask layer, respectively, and $\lambda$ is the wavelength of the light.

Satisfying the above relations permits efficient external emission, as light emitted from the peripheral wraparound portion of the diffusion region is not needlessly reflected or absorbed by the portions 16A and 14 of the layers 16 and 14. Thus, the result of this efficient external emission of light provided by this arrangement is an overall increase in light intensity and a uniform light output distribution across the emission surface.

As a specific example, with an LED in which the n-layer 12 is constituted of $GaAs_{0.6}P_{0.4}$, for the values $\lambda = 685$ nm and $n_3 = 3.57$, a possible combination of refractive indexes and thicknesses for the diffusion mask layer 14 and protective layer 16 could be $n_1 = n_2 = 1.89$, $d_1 = 272$ nm and $d_2 = 181$ nm. Of course, other combinations can also be used to satisfy the non-reflection conditions. The above compositions are not to be taken as limiting. The requisite non-reflection conditions can be satisfied with layers of other compositions such as, for example, $Al_2O_3$, $SiO_2$, and SiON.

The invention has been described in detail with particular reference to certain preferred embodiments thereof, but it will be understood that variations and modifications can be effected within the spirit and scope of the invention.

What is claimed is:

1. A light-emitting diode comprising:
   a diffused layer that constitutes one side of a p-n junction wherein light emission occurs;
   a diffusion mask layer that is formed on the diffused layer and is provided with an opening of a prescribed pattern;
   a diffusion region that constitutes the other side of the p-n junction and is formed by diffusion in the diffused layer via the opening of the diffusion mask layer;
   a surface protection layer that covers both the diffused layer and the diffusion mask layer formed thereon;
   wherein portions of the diffusion mask layer and surface protection layer that are located above the part of the diffusion region that forms a wraparound region extending laterally from the opening are each constituted according to refractive index relations that minimize the reflected light emitted from the peripheral wraparound portion of the junction.

2. A light-emitting diode comprising:
   a diffused layer that constitutes one side of a p-n junction wherein light emission occurs;
   a diffusion mask layer that is formed on the diffused layer and is provided with an opening of a prescribed pattern;
   a diffusion region that constitutes the other side of the p-n junction and is formed by diffusion in the diffused layer via the opening of the diffusion mask layer;
   a surface protection layer that covers both the diffused layer and the diffusion mask layer formed thereon;
   wherein portions of the diffusion mask layer and surface protection layer that are located above the part of the diffusion region that forms a wraparound region extending laterally from the opening are each constituted so as not to reflect light emitted from peripheral wraparound portion of the junction, and in which said portions of the diffusion mask layer and surface protection layer each satisfy the relations $$n_1^2 = n_0 \cdot n_3$$

$$n_1 \cdot d_1 = \alpha \cdot \beta/4 \text{ (where } \alpha \text{ is an odd number)}$$

$$n_2 = n_1$$

$$n_2 \cdot d_2 = \beta \cdot \lambda/4 \text{ (where } \beta = \text{ is an even number not including 0),}$$

where $n_0$, $n_1$, $n_2$, and $n_3$ denote the refractive index of, respectively, air layer, surface protection layer, diffusion mask layer, and diffused layer, and $d_1$ and $d_2$ are the thickness of the protection layer and diffusion mask layer, respectively, and $\lambda$ is the wavelength of the light produced.

* * * * *